(12) United States Patent
Baryshev et al.

(10) Patent No.: US 9,697,982 B2
(45) Date of Patent: Jul. 4, 2017

(54) APPARATUS FOR GHZ RATE HIGH DUTY CYCLE PULSING AND MANIPULATION OF LOW AND MEDIUM ENERGY DC ELECTRON BEAMS

(71) Applicant: Euclid TechLabs, LLC, Solon, OH (US)

(72) Inventors: Sergey V Baryshev, Lemont, IL (US); Chunguang Jing, Naperville, IL (US); Jiaqi Qiu, Willowbrook, IL (US); Sergey Antipov, Naperville, IL (US); Gwanghui Ha, Lisle, IL (US); June W Lau, Rockville, MD (US); Yimei Zhu, East Setauket, NY (US)

(73) Assignee: Euclid Techlabs, LLC, Solon, OH (US)

( * ) Notice: Subject to any disclaimer, the term of this patent is extended or adjusted under 35 U.S.C. 154(b) by 0 days.

(21) Appl. No.: 15/091,639

(22) Filed: Apr. 6, 2016

(65) Prior Publication Data
US 2016/0293377 A1 Oct. 6, 2016

Related U.S. Application Data

(60) Provisional application No. 62/143,667, filed on Apr. 6, 2015.

(51) Int. Cl.
*H01J 37/04* (2006.01)
*H01J 37/147* (2006.01)
*H01J 37/06* (2006.01)

(52) U.S. Cl.
CPC .......... *H01J 37/06* (2013.01); *H01J 37/1472* (2013.01); *H01J 2237/04* (2013.01); *H01J 2237/061* (2013.01); *H01J 2237/1508* (2013.01)

(58) Field of Classification Search
CPC ..................................................... H01J 37/045
(Continued)

(56) References Cited

U.S. PATENT DOCUMENTS

| | | | |
|---|---|---|---|
| 4,439,685 A * | 3/1984 | Plies ..................... | H01J 37/045 250/396 R |
| 4,721,909 A * | 1/1988 | Richardson .......... | G01R 31/305 250/396 R |

(Continued)

OTHER PUBLICATIONS

T. Hosokawa, H. Fujioka, and K. Ura, Gigahertsz stroboscopy with the scanning electron microscope, 1978 American Institute of Physics, Rev. Sci. Instrum., 49(9), Sep. 1978, pp. 1293-1299, 7 pages.

(Continued)

*Primary Examiner* — David A Vanore
(74) *Attorney, Agent, or Firm* — Maine Cernota & Rardin (57) ABSTRACT

An ElectroMagnetic-Mechanical Pulser can generate electron pulses at rates up to 50 GHz, energies up to 1 MeV, duty cycles up to 10%, and pulse widths between 100 fs and 10 ps. A modulating Transverse Deflecting Cavity ("TDC") imposes a transverse modulation on a continuous electron beam, which is then chopped into pulses by an adjustable Chopping Collimating Aperture. Pulse dispersion due to the modulating TDC is minimized by a suppressing section comprising a plurality of additional TDC's and/or magnetic quadrupoles. In embodiments the suppression section includes a magnetic quadrupole and a TDC followed by four additional magnetic quadrupoles. The TDC's can be single-cell or triple-cell. A fundamental frequency of at least one TDC can be tuned by literally or virtually adjusting its volume. TDC's can be filled with vacuum, air, or a dielectric or ferroelectric material. Embodiments are easily switchable between passive, continuous mode and active pulsed mode.

20 Claims, 4 Drawing Sheets

(58) Field of Classification Search
USPC .................. 250/396 R, 306, 492.1, 492.3
See application file for complete search history.

(56) References Cited

U.S. PATENT DOCUMENTS

| | | | | |
|---|---|---|---|---|
| 4,839,520 | A * | 6/1989 | Garth ................... | H01J 37/268 |
| | | | | 250/396 R |
| 5,107,124 | A * | 4/1992 | Winkler ................ | H01J 37/045 |
| | | | | 250/396 R |
| 8,569,712 | B2 * | 10/2013 | Knippels ............... | H01J 37/045 |
| | | | | 250/306 |
| 8,710,440 | B2 * | 4/2014 | Kiwa ................. | G01N 21/3581 |
| | | | | 250/330 |
| 9,048,060 | B2 * | 6/2015 | Kieft ....................... | H01J 37/28 |
| 2011/0168913 | A1 * | 7/2011 | Givon ...................... | G01J 3/10 |
| | | | | 250/458.1 |
| 2014/0103225 | A1 | 4/2014 | Kieft et al. | |
| 2016/0293377 | A1 * | 10/2016 | Baryshev ............... | H01J 37/06 |

OTHER PUBLICATIONS

A. Lassise, P.H.A. Mutsaers, and O.J. Luiten, Compact, low power radio frequency cavity for femtosecond electron, 2012 American Institute of Physics, Rev. Sci. Instrum. 83, 043705 (2012), 10 pgs.
Jiaqi Qiu, Gwanghui Ha, Chunguang Jing, Sergey V. Baryshev, Bryan W. Reed, Junw W. Lau and Yimei Zhu, GHz laser-free time-resolved transmission electron microscopy: A stroboscopic high-duty-cycle method, Ultramicroscopy 161 (2016), pp. 130-136, 6 pgs.

* cited by examiner

APPARATUS FOR GHZ RATE HIGH DUTY CYCLE PULSING AND MANIPULATION OF LOW AND MEDIUM ENERGY DC ELECTRON BEAMS

RELATED APPLICATIONS

This application claims the benefit of U.S. Provisional Application No. 62/143,667, filed Apr. 6, 2015, which is herein incorporated by reference in its entirety for all purposes.

STATEMENT OF GOVERNMENT INTEREST

Portions of the present invention may have been made in conjunction with Government funding under DOE SBIR Grant, Phase II, # DE-SC0013121, and there may be certain rights to the Government.

FIELD OF THE INVENTION

The invention relates to apparatus and methods for generating electron beams, and more particularly, to apparatus and methods for generating and controlling low and medium energy electron beams at very high rates.

BACKGROUND OF THE INVENTION

Generation and precise control of low and medium energy pulsed electron beams is required for many industrial, medical, and research applications, including scanning electron microscopy (SEM), transmission electron microscopy (TEM), and horizontal/vertical accelerator-based beamlines (HAB/VAB), as well as relevant experimental analytical methods that use electron beams in SEM or TEM, or HAB/VAB as probes.

In research, pulsed electron beams with ultrashort pulse durations are used for investigating dynamic processes in a variety of materials. Frequently, the electron beams are combined with other primary excitation probes such as laser beams or other photon-based probes such as X-ray beams. An example would be the "pump-probe" class of experiments.

One approach for generating electron beam pulses of a specific length and charge (i.e. intensity) in a periodic sequence is to create electron pulses directly on the surface of an electron source (cathode) by exciting the electrons using either a laser or heat combined with an external electric field.

If a laser is used as the excitation method, the sequences of electron pulses are controlled by adjusting the wavelength, power, and/or temporal structure (pulse length and repetition frequency) of the laser photon pulses. For example, if a combination of femtosecond lasers and photocathode electron emitters is used, the electron pulse lengths are strictly determined by the pulse lengths of the fs-laser and the response time of the photocathode. Using this approach, it is possible to routinely obtain pulse lengths as short as 100 femtoseconds ("fs") or less.

However, high repetition rates, defined herein as being repetition rates of at least 1 GHz or higher, are simply not available for laser-excited electron beams, because modern lasers are only capable of repetition rates on the order of 100 MHz or less (0.1 GHz or less).

In addition, it is often important in experimental systems to provide flexible and simple solutions for switching between continuous and pulsed beam modes. If the combination of a photocathode and an fs-laser is used for pulsed beam generation, then the required continuous beam must be generated using a separate thermionic or field emission source.

On the other hand, if heat combined with an external electric field is used as the excitation method, then the sequences of electron pulses are controlled by the electric field strengths and the temporal structure (pulse length and repetition frequency) of the electric field pulses.

Still another approach is to generate a continuous electron beam, and then to mechanically or electromagnetically block and unblock (i.e. "chop") the beam with a desired periodicity, according to the desired electron pulse timing in the beam sequence. Approaches that use deflecting cavity technology for chopping electron beams of tens of kV in the GHz frequency range have been known since the 1970's. However, these approaches, which typically employ just one single-cell deflecting cavity, are generally limited to pulse lengths of 1 picosecond ("ps") at best and repetition rates of 1 GHz or less. Furthermore, these approaches are only applicable for generating low energy electron beams having energies of less than 100 kilo-electron Volts ("keV"). Perhaps even more importantly, these approaches typically result in very extensive electron beam quality deterioration in both the transverse direction (beam diameter and divergence) and longitudinal direction (temporal coherence).

What is needed, therefore, is an apparatus for generating electron beams that can be pulsed at a high duty cycle with pulsing rates greater than 1 GHz and pulse length less than 1 ps, and with minimal transverse and longitudinal dispersion.

SUMMARY OF THE INVENTION

A combined ElectroMagnetic-Mechanical Pulser ("EMMP") is disclosed for generating electron beams that can be pulsed at a high duty cycle with pulsing rates greater than 1 GHz and with minimal transverse and longitudinal dispersion. The EMMP uses a continuous input electron beam derived from any source, a Transverse Deflecting Cavity ("TDC"), an adjustable Chopping Collimating Aperture ("CCA"), and a dispersion suppressing section comprising a plurality of pillbox cavity resonators, cavity resonators, and/or magnetic quadrupoles.

In embodiments, the number of electrons per pulse and the pulse repetition frequency (repetition rate) are determined by the original continuous electron beam current, the power driving the TDC, the fundamental TDC frequency (i.e. cavity size), and the aperture size. In embodiments, the disclosed EMMP device is easily switchable between passive, continuous mode and active pulsed mode, by making sure that the downstream TDCs and/or quadrupoles do not cause any deterioration of the beam quality in terms of electron coordinate-momentum space (i.e. the phase space defined by the combined locations and momentums of the electrons in the beam).

Accordingly, the disclosed EMMP produces short electron pulses (in the range of 100 fs to 10 ps) in sequences with pulse repetition rates in the range of 0.1 to 50 GHz and duty cycles up to 10%, and with medium or low energy, defined herein as between 10 keV (kilo-electron-volts) and 1 MeV (mega-electron-volts). The disclosed device is an enabling technology for SEMs, TEMs and HABs/VABs to be operated in a fundamentally different GHz stroboscopic mode. When slicing the continuous electron beam at the input, this device preserves the original beam quality at the output, such that the transverse and longitudinal phase-spaces of the input continuous beam are nearly identical to that of exiting electron pulses.

Advantages of the present invention include:

The disclosed device does not require any specialty photocathode.

No specialty laser system or heater is required.

The standard continuous electron beam is sliced into short electron pulses with high repetition rates by only allowing electrons in the continuous beam to pass through the device which have specific temporal and spatial characteristics that match a frequency required by a specific experiment.

The repetition rates of the resulting pulsed electron beam can be adjusted over a range of approximately 0.1-50 GHz, which is not possible using laser-excited beams.

Beam phase space degradation is controlled and minimized.

The advantages of the present invention include, without limitation, that it is versatile, compact, and can be used to form the basis for a number of devices to generate electron pulses with varied length and repetition rate, and excellent phase-space quality. An RF signal empowering the TDC can be used for synchronization of the disclosed EMMP device with other experimental system components, including an object or sample under an experimental study, if needed, or other pumping or probing beams.

In embodiments, the disclosed system comprises:

(i) An input through which a continuous, direct current ("dc") electron beam of low or medium energy axially enters the device.

(ii) A metallic single-cell TDC, referred to herein as the first or "modulating" TDC, operated in any of TE11n or TM11n modes, where n can be any integer, n=0, 1, 2, 3 and higher, and configured to modulate the incoming continuous electron beam transversely, i.e. perpendicularly its line of propagation, into a sinusoid according to a magnetic component (for TM modes) or electric component (for TE modes) of an electromagnetic field introduced into the TDC by an external RF generator at a fundamental frequency of the TDC resonator. Since the magnetic field oscillates with a radial frequency, the modulation force depends on the time at which electrons arrive in the TDC resonator. The amplitude of the resulting sinusoid grows as the modulated beam propagates.

(iii) A chopping collimating aperture ("CCA") with adjustable diameter located on the longitudinal axis of the electron beam and configured to chop the entering beam and reformat it into pulses. Because the aperture chops electrons on both sides of the sinusoid-modulated beam, the actual repetition rate of the resulting pulses is twice the fundamental frequency of the modulating TDC. The temporal lengths of the resulting electron pulses can be varied between about 100 femto-seconds ("fs") and about 10 pico-seconds ("ps") by adjusting the aperture diameter and/or the power of the driving RF source.

(iv) A dispersion suppressing section comprising a plurality of magnetic quadrupoles and/or TDCs (identical to the first TDC) positioned a certain distance from the CCA and configured to demodulate the pulses and reduce their emittance (angle divergence) growth, energy spread growth, and spatial lengthening due to drifting.

In embodiments, at least one of the TDC's is empty or vacuum-filled. In various embodiments, at least one of the TDC's is at least partially filled with an axially symmetric dielectric having permittivity greater than 1 and operated in any of HEM11n or HEM12n modes, where n is an integer, i.e., n=0, 1, 2, 3 or higher. For these embodiments, the continuous input electron beam is modulated by both electric and magnetic components of the electromagnetic field.

In still other embodiments at least one of the TDC's is at least partially filled with an axially symmetric ferroelectric material having permittivity greater than 1, and operated in any of HEM11n or HEM12n modes, where n is an integer, i.e., n=0, 1, 2, 3 and higher. In these embodiments the continuous input electron beam is modulated by both electric and magnetic components of the electromagnetic field. In some of these embodiments, the fundamental frequency of the TDC (hence the repetition rate of the first TDC) can be controlled by changing the permittivity of the ferroelectric layer, either by adjusting its temperature and/or by applying a dc electric potential difference across the ferroelectric material.

For lower fundamental frequencies, in some of these embodiments where TDC's are at least partially filled with a dielectric or ferroelectric materials, the size of these TDC's is the same as the size of comparable vacuum-filled TDC's, thereby allowing the EMMP device to be equally compact and yet rendered more energy efficient than the comparable empty or vacuum filled TDC's.

In some embodiments, the device includes at least one TDC having three cells, so as to remove additional off-axis displacements of the propagating electron beam. Such three-cell TDC's can be used as tunable TDC's, in place of single-cell TDC's used in other embodiments.

In still other embodiments, at least one TDC has an adjustable volume and can thereby function as a tunable resonator cavity, whereby the fundamental frequency of the TDC is tuned so as to tune the repetition rate of the EMMP device.

In yet other embodiments, the electron pulse repetition rate can be changed by replacing the first TDC with a replacement TDC having a primary resonance frequency that differs from the first TDC.

In some embodiments, the dispersion suppressing section comprises a pair of TDC's, while in similar embodiments the dispersion suppressing section comprises a magnetic quadrupole followed by a TDC. In still other embodiments, the dispersion suppressing section comprises two magnetic quadrupoles with a TDC sandwiched in between, and in yet other embodiments the dispersion suppressing section includes a magnetic quadrupole, a TDC, and at least four additional magnetic quadrupoles following the TDC. In embodiments, all TDC's included in the EMMP are identical, or at least have the same fundamental frequencies.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 5 is a block diagram of an embodiment in which the dispersion suppressing section includes two magnetic quadrupoles with a TDC sandwiched in between.

DETAILED DESCRIPTION

Figure 1:
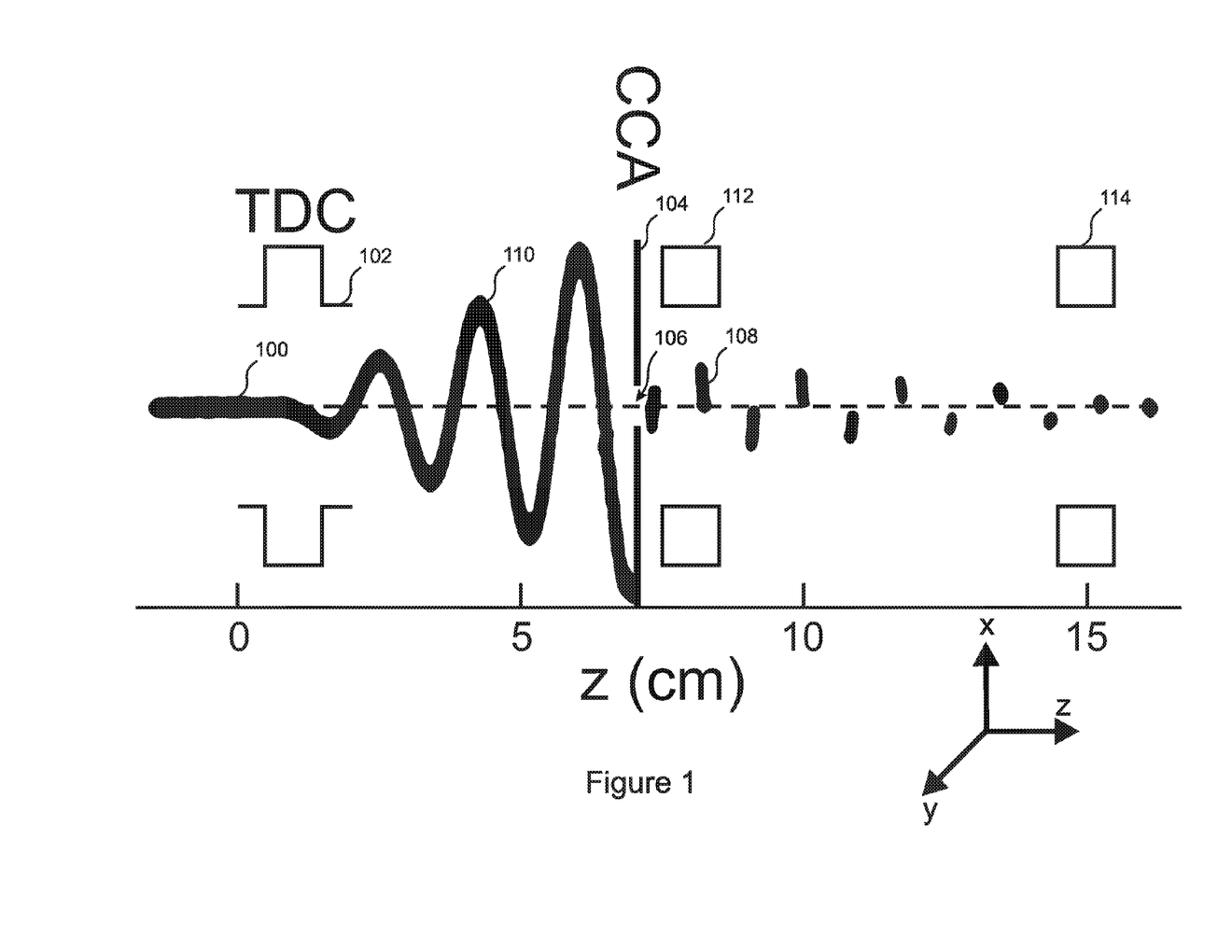
FIG. 1 is a conceptual diagram that illustrates the fundamental concepts underlying embodiments of the present invention.

Referring to FIG. 1, a conceptual diagram is shown that illustrates the fundamental concepts underlying embodiments of the present invention. In the illustrated embodiment, an initially continuous, "dc" electron beam 100 is transversely modulated into a sinusoid 110 by a pair of vacuum-filled TDC's 102, which are operated at a frequency within a range that extends from below 1 GHz to above 10 GHz. The amplitude of the sinusoid 110 grows as the modulated beam propagates, and then the beam 110 impinges upon a chopping, collimating aperture, or "CCA" 104, having an opening 106 that is adjustable between 10 and 200 μm. The CCA "chops" the beam into pulses 108 that emerge from the CCA at an ultrahigh repetition rate that is twice the TDC modulation rate, because the pulses 108 are produced by cutting the sinusoid 110 of the beam modulation on both the up-swing and the down-swing. The aperture opening 106 and the modulating field of the TDC tune the pulse lengths to between 100 fs and 10 ps, resulting in duty cycles of the EMMP device of less than or equal to 20%.

After the beam 100 has been chopped into pulses 108, both the beam size and the divergence of the stream of pulses 108 will increase. As shown in FIG. 1, additional components 112, 114 are included in a divergence suppressing section downstream of the CCA 110 that reverses and suppresses this divergence. In the embodiment of FIG. 1, the divergence is partially suppressed by two additional components 112, 114 which can be two additional TDC's 112 and 114, or a magnetic quadrupole 112 followed by an additional TDC 114. This basic design removes energy spread and significantly reduces transverse-longitudinal correlations (i.e. x-z and y-z correlations) introduced by first TDC 102. But it does not restore the correct relation between the two transverse spatial components (i.e. x and y). In similar embodiments, as discussed in more detail below, various other combinations of TDC's and magnetic quadrupoles are utilized to more effectively demodulate the beam and reduce the spatial distortions, the emittance growth, and the energy spread. In embodiments, all TDC's included in the EMMP are identical, or at least have the same fundamental frequencies.

At the last step, matching schemes after 114 included in the dispersion suppressing section bring the two transverse (with respect to the optical beam axis z) spatial components into the correct relation with each other. Namely, the two transverse beam components x and y of the pulsed beam 108 are made to be approximately equal, a state which is referred to herein as a "round beam." Ideally, the continuous input electron beam 100 is round, but the electron pulses 108 emerging from the CCA 104 are not generally round anymore. The goal of having a matching scheme 114 is to make the pulsed beam 108 round again.

For example, a vacuum TDC 102, externally driven by an RF source, operated in TM110 mode at $f_0$=10 GHz (corresponding to a TDC diameter of 39 mm) and a CCA 104 can be used to form ultrahigh repetition rate pulse sequences having a repetition rate of 20 GHz (because pulses are produced by cutting both sides of the 10 GHz sinusoid). At the fixed fundamental TDC frequency of 10 GHz, the pulse length can be continuously changed between 100 fs and 10 ps by varying the CCA diameter and/or RF power in the TDC. The exact range of duty cycle depends on the ratio of the diameters of the TDC (determining $f_0$) and the CCA, and the power fed by the RF source into the TDC. For the TM110 mode in a pillbox, a general relation between all the parameters involved is described as $$P \propto B^2 = \frac{r \times m_e}{d \times e \times \Delta t} \qquad (1)$$

where P and B are power and magnetic component of the electromagnetic field in the TDC 102, respectively; $m_e$ and e are the electron mass and charge, respectively; r is the radius of the CCA 104; d is the free-drifting distance between the TDC 102 and the CCA 104; and $\Delta t$ is the electron pulse length. This leads to duty cycles of up to $2 \times 10^{-1}$ (or 20%).

Note that the TDC technology is downwards compatible to sampling rates (or strobe rates) below 1 GHz by replacing vacuum in the TDC with a high permittivity dielectric. The general relation linking the TDC diameter (D), the fundamental TDC frequency ($f_0$) and the permittivity ($\epsilon$) is $$D \sim \frac{1}{f_0 \times \sqrt{\epsilon}} \qquad (2)$$

With a high permittivity ferroelectric, the TDC can be continuously tunable too in a specific frequency range.

Figure 2A:
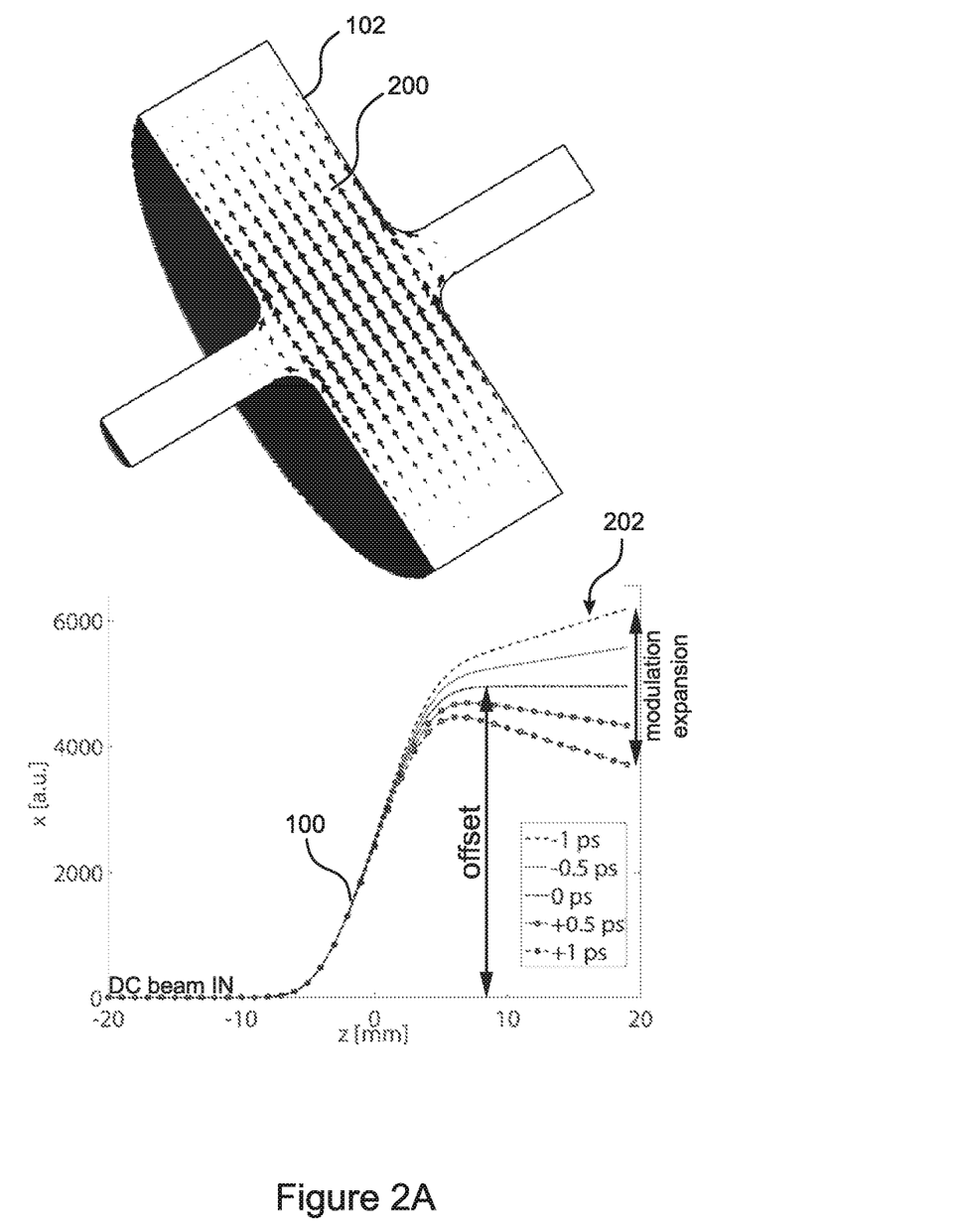
FIG. 2A is a graphical illustration indicating the functioning and resulting beam dispersion of the first, modulating TDC in an embodiment where the first TDC is a single-cell TDC having a cavity with the magnetic field Hx of TM110 mode on-axis oriented transversely with respect to the beam propagation direction through the pipes on both ends of the cavity.
Figure 2B:
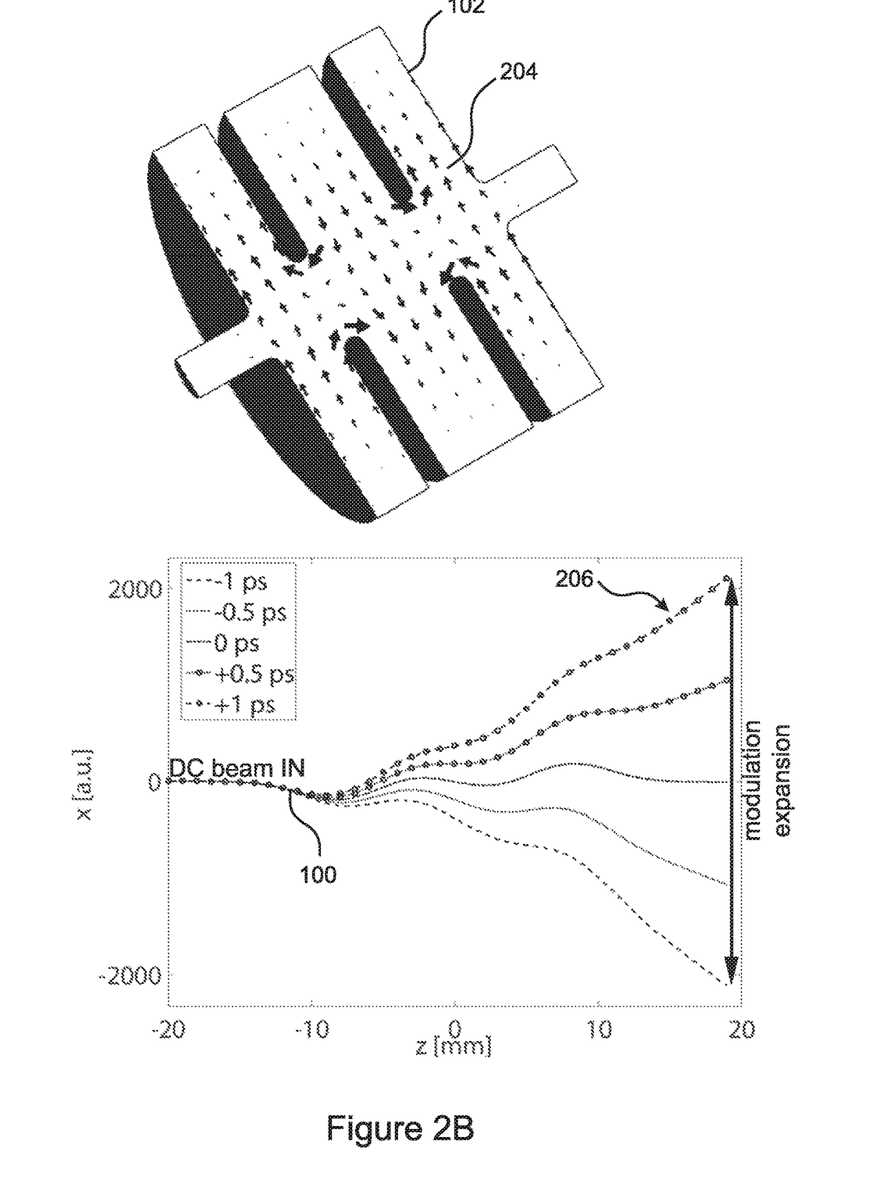
FIG. 2B is a graphical illustration of the functioning and resulting beam dispersion in an embodiment similar to FIG. 2A, but where the first TDC is a three-cell TDC.

With reference to FIGS. 2A, 2B, 3, and 4, additional magnetic quadrupoles and TDCs and/or TDC design modifications from a single-cell design to a three-cell design can further demodulate the beam 100 and reduce spatial distortions, the emittance growth and the energy spread. FIG. 2A illustrates the field distribution 200 within a single cell TDC 102, and the resulting dispersion 202 of the electron beam 100. FIG. 2B illustrates the field distribution 204 within a three cell TDC 102, and the resulting dispersion 206 of the electron beam 100.

Figure 3:
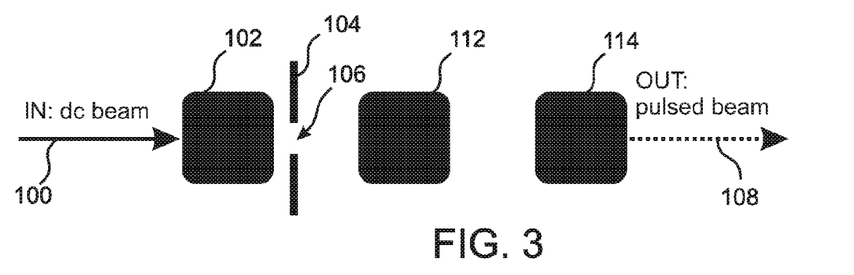
FIG. 3 is a block diagram of an embodiment in which the dispersion suppressing section includes two TDC's.
Figure 4:
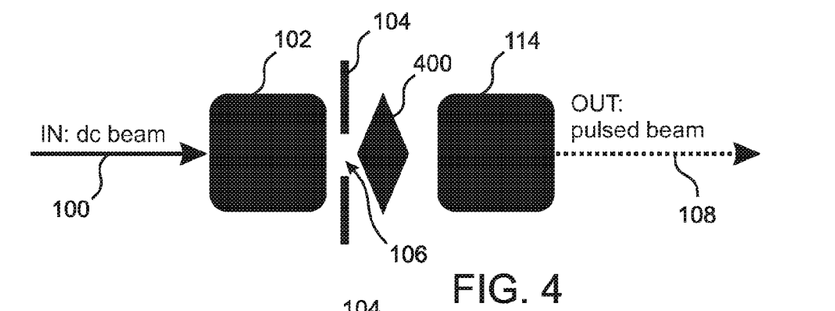
FIG. 4 is a block diagram of an embodiment in which the dispersion suppressing section includes a magnetic quadrupole followed by a TDC.

FIG. 3 is a simplified block diagram illustrating the embodiment of FIG. 1, whereas FIG. 4 is a simplified block diagram illustrating a similar embodiment in which the dispersion suppression section includes a magnetic quadrupole 400 in lieu of the second TDC's 112.

Figure 5:
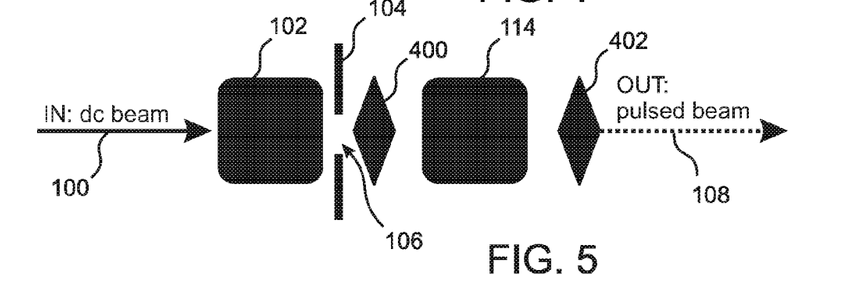

FIG. 5 illustrates an embodiment that is similar to FIG. 4 but includes a second identical magnetic quadrupole 402. This design is able to restore the ideal relation between the x and y components of the electron pulses 108, making the pulsed beam 108 round. While FIG. 5 illustrates a "simplest matching" solution, the alignment of the entire EMMP for this embodiment must be changed every time there is a change to the continuous input beam 100. If the continuous input beam is fixed, the EMMP alignment remains fixed once its best alignment has been found and set.

Figure 6:
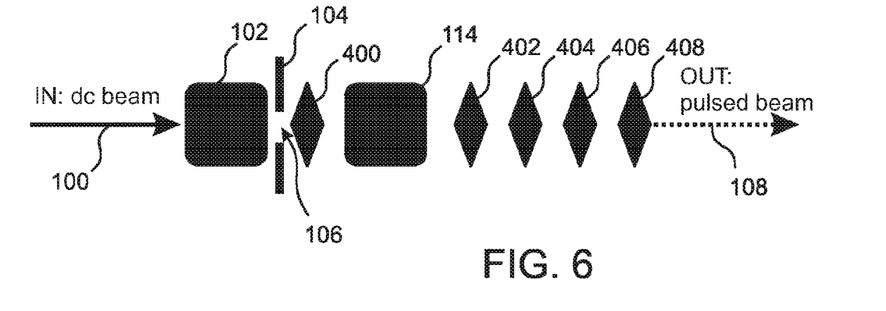
FIG. 6 is a block diagram of an embodiment in which the dispersion suppressing section includes a magnetic quadrupole and a TDC, followed by four additional magnetic quadrupoles.

FIG. 6 illustrates an embodiment similar to FIG. 5 that includes an additional quadrupole triplet 404, 406, 408 of magnetic quadrupoles. This quadrupole triplet 404, 406, 408 functions as a matching section that is able to preserve the "roundness" of the pulsed beam 108, regardless of any variations of the continuous input beam parameters. Hence, while this design of the matching scheme in FIG. 6 is more complex than for FIG. 5, the optimal EMMP alignment, once established and set, remains the same even if the parameters of the input beam 100 are changed.

The design of specific solutions for removing the post-TDC distortions of the resulting electron pulses can be facilitated through the use of generalized matrix calculations in thin lens approximation. Matrix components depend on the type of the components, allowing the strength of various effects on electron dynamics in the phase space to be crudely predicted and evaluated. The matrix methodology disclosed herein relies on three basic assumptions:

(1) electron optics elements are approximated as thin lenses;
(2) a single particle/electron is considered; and
(3) only linear matrix transformations are considered.

These three assumptions are intertwined. When combined, they establish the basis for the geometrical optics framework in which the problem is solved. This idealized framework provides a good first-order model for rapid progress in the design, to be followed up with full ray-trace calculations including space charge effects to determine the effects of aberrations and undesired couplings on the electron phase space. An initial and a final state of an electron at input and at the output of the EMMP are linked in the momentum-coordinate phase space via a beam transport matrix as follows:

$$\begin{pmatrix} x_f \\ x'_f \\ y_f \\ y'_f \\ z_f \\ \frac{\Delta p_f}{p_0} \end{pmatrix} = \begin{pmatrix} R_{11} & R_{12} & R_{13} & R_{14} & R_{15} & R_{16} \\ R_{21} & R_{22} & R_{23} & R_{24} & R_{25} & R_{26} \\ R_{31} & R_{32} & R_{33} & R_{34} & R_{35} & R_{36} \\ R_{41} & R_{42} & R_{43} & R_{44} & R_{45} & R_{46} \\ R_{51} & R_{52} & R_{53} & R_{54} & R_{55} & R_{56} \\ R_{61} & R_{26} & R_{63} & R_{64} & R_{65} & R_{66} \end{pmatrix} \begin{pmatrix} x_i \\ x'_i \\ y_i \\ y'_i \\ z_i \\ \frac{\Delta p_i}{p_0} \end{pmatrix} \quad (3)$$

where x is the relative horizontal beam position, x' is the horizontal divergence, y is the relative vertical beam position, y' is the vertical divergence, z is the relative longitudinal position or time, and $\Delta p/p_0$ is the relative longitudinal $P_0$ momentum. In Eq. 3, the matrix R(6×6) is called the "transport" matrix. It is a result of multiplication of all matrices describing every single component of an EMMP design, including the drifting matrix, which describes empty gaps/pipes between hardware components. The perfect case is when the matrix R has only diagonal elements, indicating that an electron beam transformation took place, yet cross-correlations, described by off-diagonal elements resulting in pulse size change in transverse and longitudinal directions and energy spread, are absent.

A number of combinations and designs were analyzed, and the main conclusion was that at least 2 active elements in the divergence suppression section must be present, after the CCA, to minimize the off-diagonal elements in the transport matrix. While the first element is always a TDC 102, second and third elements are shown as blank squares 112, 114 in FIG. 1, and should be determined from the matrix analysis. In general, these elements can be combinations of TDC's and/or magnetic quadrupoles (MQ's). Two such designs are illustrated in FIGS. 3 and 4. Thus, the resulting matrix is R(6×6) for the embodiments of FIG. 3 and FIG. 4, and the R-matrix is the product of 5-fold multiplication of 3 key matrices.

A free drift beam pipe of length d (empty space between either pair of optical components in the EMMP) [measured in meters] is described by the following $$\begin{pmatrix} 1 & d & 0 & 0 & 0 & 0 \\ 0 & 1 & 0 & 0 & 0 & 0 \\ 0 & 0 & 1 & d & 0 & 0 \\ 0 & 0 & 0 & 1 & 0 & 0 \\ 0 & 0 & 0 & 0 & 1 & \frac{d}{\gamma^2} \\ 0 & 0 & 0 & 0 & 0 & 1 \end{pmatrix}, \quad (4)$$

where $\gamma$ is the Lorentz factor. Its value depends on the electron energy. The magnetic quadrupole with a focal length f [measured in meters] is described as $$\begin{pmatrix} 1 & 0 & 0 & 0 & 0 & 0 \\ \frac{1}{f} & 1 & 0 & 0 & 0 & 0 \\ 0 & 0 & 1 & 0 & 0 & 0 \\ 0 & 0 & -\frac{1}{f} & 1 & 0 & 0 \\ 0 & 0 & 0 & 0 & 1 & 0 \\ 0 & 0 & 0 & 0 & 0 & 1 \end{pmatrix}. \quad (5)$$

The TDC has a matrix $$\begin{pmatrix} 1 & 0 & 0 & 0 & 0 & 0 \\ 0 & 1 & 0 & 0 & k & 0 \\ 0 & 0 & 1 & 0 & 0 & 0 \\ 0 & 0 & 0 & 1 & 0 & 0 \\ 0 & 0 & 0 & 0 & 1 & 0 \\ k & 0 & 0 & 0 & 0 & 1 \end{pmatrix} \quad (6)$$

where k is the transverse momentum acquired by an electron in the TDC, measured in reciprocal meters or eV. In what follows, k will be referred to as the "kick." Resulting transport matrices for the designs sketched in FIGS. 3 and 4 can be optimized in order to zero as many off-diagonal elements as possible.

As an example, the following parameters of the continuous input beam can be considered: (1) beam energy ($E_0$) 200 keV; (2) energy spread ($\Delta E$) 0.5 eV; (3) emittance 1.5 nm×rad which is a product of a beam diameter of 10 μm and a divergence angle of 0.15 mrad. For the 3TDC (FIG. 3) design, the R-matrix is $$\begin{pmatrix} 1 - \frac{d_1(d_1+d_2)k_1^2}{\gamma^2} & d_1+d_2 & 0 & 0 & 0 & -\frac{d_1(d_1+d_2)k_1}{\gamma^2} \\ -\frac{d_1(d_1+d_2)k_1^2}{d_2\gamma^2} & 1+\frac{d_1^2(d_1+d_2)k_1^2}{d_2(d_1(d_1+d_2)k_1^2-\gamma^2)} & 0 & 0 & 0 & -\frac{d_1^2(d_1+d_2)^2k_1^3}{d_2(d_1^2k_1^2+d_1d_2k_1^2-\gamma^2)} \\ 0 & 0 & 1 & d_1+d_2 & 0 & 0 \\ 0 & 0 & 0 & 1 & 0 & 0 \\ 0 & -\frac{d_1(d_1+d_2)k_1}{\gamma^2} & 0 & 0 & 1-\frac{d_1(d_1+d_2)k_1^2}{\gamma^2} & \frac{d_1+d_2}{\gamma^2} \\ 0 & -\frac{d_1^2(d_1+d_2)^2k_1^3}{d_2(d_1^2k_1^2+d_1d_2k_1^2-\gamma^2)} & 0 & 0 & -\frac{d_1(d_1+d_2)k_1^2}{d_2} & 1+\frac{d_1^2(d_1+d_2)k_1^2}{d_2(d_1(d_1+d_2)k_1^2-\gamma^2)} \end{pmatrix} \quad (7)$$

where $k_2=(d_1+d_2)/d_2$ and $k_3=\gamma^2 d_1 k_1/(\gamma^2-d_1(d_1+d_2)k_1^2)$ are found optimal for the overall system design, i.e. maximum off-diagonal elements are zeros.

The TDC+MQ+TDC design (FIG. 4) has a transport matrix $$\begin{pmatrix} -\frac{d_2}{d_1} & 0 & 0 & 0 & 0 & 0 \\ -\frac{(\gamma^2-d_1^2k_1^2)(d_1+d_2)}{d_1d_2\gamma^2} & -\frac{d_1}{d_2} & 0 & 0 & 0 & \frac{d_1k_1(d_1+d_2)}{d_2\gamma^2} \\ 0 & 0 & 2+\frac{d_1}{d_2} & 2(d_1+d_2) & 0 & 0 \\ 0 & 0 & \frac{d_1+d_2}{d_1d_2} & 2+\frac{d_1}{d_2} & 0 & 0 \\ \frac{k_1(d_1+d_2)}{\gamma^2} & 0 & 0 & 0 & 1 & \frac{d_1+d_2}{\gamma^2} \\ 0 & 0 & 0 & 0 & 0 & 1 \end{pmatrix} \quad (8)$$

where $d_1$ and $d_2$ are the drift distances between the first TOC 102 and the MQ 400, and between the MQ 400 and the second TOC 114 respectively, and $k_1$ is the kick strength of the first TOC 102. The focal length of the MQ 400 is $f=-d_1d_2/(d_1+d_2)$ and the kick strength of the second deflecting cavity is $k_2=d_1/d_2 \, k_1$.

From the matrix (8) describing the TDC+MQ+TDC case, it can be seen that two block sub-matrices for the two transverse beam components x and y are different (namely, $R_{11}$, $R_{12}$, $R_{21}$, $R_{22}$ which are related to x and $R_{33}$, $R_{34}$, $R_{43}$, $R_{44}$ which are related to y). To make the beam round, one needs to make $R_{11}=R_{33}$, $R_{12}=R_{34}$, $R_{21}=R_{43}$, $R_{22}=R_{44}$. This is performed through additional MQ's (1 or 4) after the second TDC 114. Once these conditions are satisfied, x and y are equal at the output, meaning the pulsed beam is round (assuming that the continuous input beam is round).

From the matrices presented in (7) and (8) above, it can be seen that in transverse directions both designs (FIG. 3 and FIG. 4) may lead to satisfactory results, such that sufficient spatial coherence in the beam is conserved upon EMMP installation. The main problem here is the matrix term $R_{65}$ which is responsible for energy spread growth. In this idealized geometrical optics framework, $R_{65}$ is zero for the TDC+MQ+TDC design of FIG. 4, but is finite for the 3 TDC design of FIG. 3. That is, in the 3 TDC case, the additional energy spread at $E_0=200$ keV is higher than 1 eV on top of the default/intrinsic energy spread of 0.5 eV.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application.

This specification is not intended to be exhaustive. Although the present application is shown in a limited number of forms, the scope of the invention is not limited to just these forms, but is amenable to various changes and modifications without departing from the spirit thereof. One or ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

I claim:

1. A combined ElectroMagnetic-Mechanical Pulser ("EMMP") comprising:
    an input configured to accept input of a continuous electron beam;
    a first Transverse Deflecting Cavity ("TDC") downstream of the input and configured to impose an oscillatory transverse deflection on the electron beam according to at least one of a time-varying electric field and a time-varying magnetic field generated within the first TDC;
    a Chopping Collimating Aperture ("CCA") downstream of the first TDC and configured to block the electron beam when its deflection exceeds a threshold maximum or minimum, thereby chopping the electron beam into a stream of electron pulses having an electron pulse repetition rate;

a dispersion suppressing section downstream of the CCA and configured to suppress a residual dispersion of the stream of electron pulses arising from the deflection imposed by the first TDC, the dispersion suppressing section including at least two elements selected from the group comprising TDC's and magnetic quadrupoles; and an output downstream of the dispersion suppressing section and configured to allow the stream of electron pulses to emerge from the EMMP.

2. The EMMP of claim 1, wherein the EMMP is able to produce streams of electron pulses having electron pulse repetition rates up to 50 GHz combined with pulse lengths in the range 100 fs to 10 ps, electron energies up to 1 MeV and duty cycles up to 10%.

3. The EMMP of claim 2, wherein the EMMP is able to produce streams of electron pulses having pulse repetition rates as low as 100 MHz.

4. The EMMP of claim 1, wherein the EMPP can be switched between an active mode that chops the electron beam and a passive mode that passes the electron beam through the EMMP without alteration.

5. The EMMP of claim 1, wherein the first TDC is a single-cell TDC.

6. The EMMP of claim 1, wherein the first TDC is a three-cell TDC.

7. The EMMP of claim 1, wherein at least one of the TDC's is empty or vacuum-filled.

8. The EMMP of claim 1, wherein at least one of the TDC's is a filled TDC that is at least partially filled with an axially symmetric dielectric material having permittivity greater than 1.

9. The EMMP of claim 1, wherein at least one of the TDC's is a filled TDC that is at least partially filled with an axially symmetric ferroelectric material having permittivity greater than 1.

10. The EMMP of claim 9, wherein a fundamental frequency of the filled TDC can be controlled by changing the permittivity of the ferroelectric material by at least one of adjusting its temperature and applying a dc electric potential difference across the ferroelectric material.

11. The EMMP of claim 1, wherein at least one TDC in the dispersion suppression section is a three-cell TDC.

12. The EMMP of claim 1, wherein a fundamental frequency of at least one TDC included in the EMMP can be tuned by adjusting a volume of the TDC.

13. The EMPP of claim 1, wherein the electron pulse repetition rate can be changed by replacing the first TDC with a replacement TDC having a primary resonance frequency that differs from the first TDC.

14. The EMMP of claim 1, wherein a fundamental frequency of the first TDC can be tuned by adjusting a volume of the first TDC, thereby adjusting the electron pulse repetition rate of the EMMP.

15. The EMMP of claim 1, wherein the dispersion suppressing section includes a second TDC and a third TDC.

16. The EMMP of claim 1, wherein the dispersion suppressing section includes a magnetic quadrupole followed by a second TDC.

17. The EMMP of claim 1, wherein the dispersion suppressing section includes two magnetic quadrupoles with a second TDC sandwiched in between them.

18. The EMMP of claim 1, wherein the dispersion suppressing section includes a first magnetic quadrupole and a second TDC, followed by four additional magnetic quadrupoles.

19. The EMPP of claim 1, wherein all TDC's included in the dispersion suppressing section are identical to the first TDC.

20. A device for producing a stream of electron pulses, the device comprising:

a continuous electron beam generator, configured to emit a continuous electron beam;

a first Transverse Deflecting Cavity ("TDC") downstream of the continuous electron beam generator and configured to impose an oscillatory transverse deflection on the electron beam according to at least one of a time-varying electric field and a time-varying magnetic field generated within the first TDC;

a Chopping Collimating Aperture ("CCA") downstream of the first TDC and configured to block the electron beam when its deflection exceeds a threshold maximum or minimum, thereby chopping the electron beam into a stream of electron pulses having an electron pulse repetition rate;

a dispersion suppressing section downstream of the CCA and configured to suppress a residual dispersion of the stream of electron pulses arising from the deflection imposed by the first TDC, the dispersion suppressing section including at least two elements selected from the group comprising TDC's and magnetic quadrupoles; and an output downstream of the dispersion suppressing section and configured to allow the stream of electron pulses to emerge from the EMMP.

\* \* \* \* \*